United States Patent
Park et al.

(10) Patent No.: US 9,983,481 B2
(45) Date of Patent: May 29, 2018

(54) STRIPPER COMPOSITION FOR REMOVING PHOTORESISTS AND METHOD FOR STRIPPING PHOTORESISTS USING THE SAME

(71) Applicant: LG CHEM, LTD., Seoul (KR)

(72) Inventors: Tae Moon Park, Daejeon (KR); Dae Chul Jung, Daejeon (KR); Dong Hoon Lee, Daejeon (KR); Woo Ram Lee, Daejeon (KR); Hyun Jun Lee, Daejeon (KR); Ju Young Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 29 days.

(21) Appl. No.: 15/318,539

(22) PCT Filed: Aug. 18, 2015

(86) PCT No.: PCT/KR2015/008608
§ 371 (c)(1),
(2) Date: Dec. 13, 2016

(87) PCT Pub. No.: WO2016/028057
PCT Pub. Date: Feb. 25, 2016

(65) Prior Publication Data
US 2017/0115573 A1  Apr. 27, 2017

(30) Foreign Application Priority Data
Aug. 20, 2014 (KR) .................. 10-2014-0108634

(51) Int. Cl.
| | | |
|---|---|---|
| *G03F 7/32* | (2006.01) | |
| *G03F 7/42* | (2006.01) | |
| *G03F 7/40* | (2006.01) | |
| *G03F 7/11* | (2006.01) | |
| *H01L 21/027* | (2006.01) | |
| *C11D 3/00* | (2006.01) | |
| *C11D 3/20* | (2006.01) | |
| *C11D 3/28* | (2006.01) | |
| *C11D 3/30* | (2006.01) | |
| *C11D 3/32* | (2006.01) | |
| *C11D 3/37* | (2006.01) | |
| *C11D 3/43* | (2006.01) | |
| *C11D 11/00* | (2006.01) | |
| *H01L 21/02* | (2006.01) | |

(52) U.S. Cl.
CPC .............. *G03F 7/42* (2013.01); *C11D 3/0073* (2013.01); *C11D 3/2068* (2013.01); *C11D 3/28* (2013.01); *C11D 3/30* (2013.01); *C11D 3/32* (2013.01); *C11D 3/373* (2013.01); *C11D 3/43* (2013.01); *C11D 11/0047* (2013.01); *G03F 7/11* (2013.01); *G03F 7/325* (2013.01); *G03F 7/40* (2013.01); *G03F 7/425* (2013.01); *G03F 7/426* (2013.01); *H01L 21/0206* (2013.01); *H01L 21/0274* (2013.01); *H01L 21/0276* (2013.01)

(58) Field of Classification Search
CPC ... G03F 7/325; G03F 7/11; G03F 7/40; C11D 11/0047; H01L 21/0274; H01L 21/0276; H01L 21/3081
USPC ......... 430/270.1, 271.1, 434, 435, 325, 322, 430/330, 331, 329, 436; 510/175, 176
See application file for complete search history.

(56) References Cited

U.S. PATENT DOCUMENTS

| | | | |
|---|---|---|---|
| 8,883,699 B2 * | 11/2014 | Kim ...................... | G03F 7/425 134/1.2 |
| 9,081,291 B2 * | 7/2015 | Park ...................... | G03F 7/425 |
| 2001/0013502 A1 | 8/2001 | Nohara et al. | |
| 2004/0048761 A1 | 3/2004 | Ikemoto | |
| 2004/0137379 A1 | 7/2004 | Ikemoto | |
| 2006/0270574 A1 * | 11/2006 | Ikemoto .................. | G03F 7/425 510/176 |
| 2010/0151610 A1 * | 6/2010 | Choung .................. | G03F 7/425 438/34 |
| 2010/0190112 A1 * | 7/2010 | Wakiya ................... | C11D 1/62 430/313 |
| 2013/0099260 A1 * | 4/2013 | Kim ...................... | G03F 7/425 257/88 |

(Continued)

FOREIGN PATENT DOCUMENTS

| | | |
|---|---|---|
| JP | 3953600 B2 | 8/2007 |
| JP | 4208924 B2 | 10/2008 |

(Continued)

OTHER PUBLICATIONS

Machine translation of KR 2014-0110383 (no date).*
International Search Report issued for International Application No. PCT/KR2015/008608 dated Dec. 7, 2015 (9 pages).

*Primary Examiner* — Amanda C Walke
(74) *Attorney, Agent, or Firm* — Rothwell, Figg, Ernst & Manbeck, P.C.

(57) ABSTRACT

The present invention relates to a stripper composition for removing photoresists which comprises: a chained amine compound having a weight average molecular weight of more than 95 g/mol; a chained amine compound having a weight average molecular weight of not more than 90 g/mol; a cyclic amine compound; an amide-based compound in which a linear or branched alkyl group having 1-5 carbon atoms is mono- or di-substituted with nitrogen; and a polar organic solvent, wherein the weight ratio of the chained amine compound having a weight average molecular weight of more than 95 g/mol to the chained amine compound having the weight average molecular weight of not more than 90 g/mol is 1:1 to 1:10, and a method for stripping a photoresist using the same.

17 Claims, No Drawings

(56) References Cited

U.S. PATENT DOCUMENTS

2018/0051237 A1\* 2/2018 Seino .................. C11D 11/0047

FOREIGN PATENT DOCUMENTS

| KR | 10-2004-0023517 A | 3/2004 |
|----|-------------------|--------|
| KR | 10-2004-0064234 A | 7/2004 |
| KR | 10-2004-0083157 A | 10/2004 |
| KR | 10-2010-0070087 A | 6/2010 |
| KR | 10-2010-0110977 A | 10/2010 |
| KR | 10-1213731 B1 | 12/2012 |
| KR | 10-2013-0025830 A | 3/2013 |
| KR | 10-1341746 B1 | 12/2013 |
| KR | 10-2014-0024625 A | 3/2014 |
| KR | 10-2014-0110383 A | 9/2014 |
| WO | 2006/062534 A1 | 6/2006 |

\* cited by examiner

STRIPPER COMPOSITION FOR REMOVING PHOTORESISTS AND METHOD FOR STRIPPING PHOTORESISTS USING THE SAME

CROSS-REFERENCE TO RELATED APPLICATION(S)

This application is a 35 U.S.C. § 371 National Phase Entry Application from PCT/KR2015/008608, filed on Aug. 18, 2015, and designating the United States, which claims priority under 35 U.S.C. § 119 to Korean Patent Application No. 10-2014-0108634 filed on Aug. 20, 2014, the disclosure of which is incorporated herein by reference in its entirety.

TECHNICAL FIELD OF THE INVENTION

The present invention relates to a stripper composition for removing photoresists and a method for stripping photoresists using the same.

More particularly, the present invention relates to a stripper composition for removing photoresists which is capable of exhibiting excellent stripping and rinsing abilities for the photoresists and of minimizing reduction in its physical properties with the passage of time, even without inclusion of a solvent which shows a reproductive toxicity, and to a method of stripping photoresists using the same.

BACKGROUND OF THE INVENTION

The manufacturing process for microcircuits or semiconductor integrated circuits of liquid crystal display devices comprises several steps of: forming a variety of lower films such as a conductive metal film that is made of aluminum, an aluminum alloy, copper, a copper alloy, molybdenum, or a molybdenum alloy, or an insulating film such as silicon oxide film, a silicon nitride film, or an acryl insulating film on a substrate; uniformly coating a photoresist on such a lower film; optionally exposing and developing the coated photoresist to form a photoresist pattern; and patterning the lower film with the photoresist pattern as a mask.

After these patterning steps, a process of removing the photoresists remaining on the lower film is undergone. For this purpose, a stripper composition for removing the photoresists is used.

Previously, stripper compositions including amine compounds, polar protic solvents and polar aprotic solvents, and the like have been well known. Among them, stripper compositions including N-methyl formamide (NMF) as the polar aprotic solvent have been widely used.

These stripper compositions including NMF are known to exhibit excellent stripping ability of the photoresists. However, such NMF is a Category 1B (GHS Standard) material showing a reproductive toxicity and its use is being gradually restricted.

On this account, various attempts have been made to develop stripper compositions showing excellent stripping and rinsing abilities without using NMF, but such stripper compositions showing sufficient stripping and rinsing abilities have not been properly developed so far.

Moreover, conventional stripper compositions including the NMF promote decomposition of the amine compounds with the passage of time and so there were problems in that the stripping and rinsing abilities are lowered with the passage of time.

In particular, these problems can further accelerate when a part of the remaining photoresist is dissolved in the stripper composition, depending on the application times of the stripper composition.

In view of these circumstances, in order to maintain excellent stripping and rinsing abilities with the passage of time, a method for incorporating an excess amount of amine compounds in the stripper composition has been adopted in the prior art. However, in this case, the economy and efficiency of the process may be greatly reduced, and there may incur environmental and procedural problems due to the incorporation of the excess amount of amine compounds.

Thus, there is a need to develop a new stripper composition which is capable of maintaining excellent stripping and rinsing abilities with the passage of time while not including a solvent showing a reproductive toxicity.

SUMMARY OF THE INVENTION

It is an object of the present invention to provide a stripper composition for removing photoresists which is capable of exhibiting excellent stripping and rinsing abilities for the photoresists and of minimizing reduction in its physical properties with the passage of time, even without inclusion of a solvent which shows a reproductive toxicity.

It is another object of the present invention to provide a method for stripping photoresists using the above-described stripper composition for removing photoresists.

In order to achieve these objects, and other objects which will be become apparent from the description which follows, the present invention provides a stripper composition for removing photoresists which comprises: a chained amine compound having a weight average molecular weight of more than 95 g/mol; a chained amine compound having a weight average molecular weight of not more than 90 g/mol; a cyclic amine compound; an amide-based compound in which a linear or branched alkyl group having 1-5 carbon atoms is mono- or di-substituted with nitrogen; and a polar organic solvent, wherein the weight ratio of the chained amine compound having a weight average molecular weight of more than 95 g/mol to the chained amine compound having the weight average molecular 0 g/mol is 1:1 to 1:10.

The present invention also provides a method for stripping photoresists which comprises the steps of: forming a photoresist pattern on a substrate in which a lower film is formed; patterning the lower film with the photoresist pattern; and stripping the photoresist using the above stripper composition for removing photoresists.

DETAILED DESCRIPTION OF THE INVENTION

Below, the stripper composition for removing photoresists and the method for stripping photoresists using the same in accordance with specific embodiments of the present invention will be described in more detail.

The term "chained" as used herein is a chemical structure in which carbon atoms consist in a chain form, includes both a straight chain form and a branched chain form, and refers to a chemical structure, in contrast with a cyclic structure.

According to one embodiment of the present invention, a stripper composition for removing photoresists which comprises: a chained amine compound having a weight average molecular weight of more than 95 g/mol; a chained amine compound having a weight average molecular weight of not more than 90 g/mol; acyclic amine compound; an amide-based compound in which a linear or branched alkyl group having 1-5 carbon atoms is mono- or di-substituted with nitrogen; and a polar organic solvent, wherein the weight ratio of the chained amine compound having a weight average molecular weight of more than 95 g/mol to the chained amine compound having the weight average molecular weight of not more than 90 g/mol is 1:1 to 1:10 can be provided.

The present inventors have found through numerous experiments that, when using a stripper composition for removing photoresists which comprises: a chained amine compound having a weight average molecular weight of more than 95 g/mol; a chained amine compound having a weight average molecular weight of not more than 90 g/mol; a cyclic amine compound; an amide-based compound in which a linear or branched alkyl group having 1-5 carbon atoms is mono- or di-substituted with nitrogen; and a polar organic solvent, wherein the weight ratio of the chained amine compound having a weight average molecular weight of more than 95 g/mol to the chained amine compound having the weight average molecular weight of not more than 90 g/mol is 1:1 to 1:10, the solubility of the amine compounds in the polar organic solvent is improved and the stripper composition for removing photoresists is effectively immersed on the lower film in which the photoresist pattern remains, thus having excellent stripping and rinsing abilities for the photoresists. The present invention has been completed on the basis of such a finding.

Specifically, the stripper composition for removing photoresists may include a chained amine compound having a weight average molecular weight of not more than 90 g/mol or a weight average molecular weight of 50 g/mol to 80 g/mol.

The chained amine compound having a weight average molecular weight of not more than 90 g/mol contains a relatively smaller amount of straight or branched chains in the molecule and so a high polarity in the molecule can be maintained.

Accordingly, the solubility in the polar solvent can be increased and the stripper composition for removing photoresists can be effectively immersed on the lower film and maintained for a certain time or more, thus improving the rinsing ability of photoresists.

The chained amine compound having a weight average molecular weight of not more than 90 g/mol may include 1-aminoisopropanol (AIP), monomethanol amine, monoethanol amine, 2-methylaminoethanol (MMEA), 3-aminopropanol (AP), N-methylethylamine (N-MEA) or a mixture of two or more thereof.

The chained amine compound having a weight average molecular weight of not more than 90 g/mol may be contained in an amount of 0.5 to 20% by weight, or 0.7 to 15% by weight, or 1 to 10% by weight based on the total weight of the photoresist composition.

If the content of the chained amine compound having a weight average molecular weight of not more than 90 g/mol is less than 0.5% by weight based on the total weight of the composition, the rinsing ability of the stripper composition for removing photoresists can be reduced.

Further, if the content of the chained amine compound having a weight average molecular weight of not more than 90 g/mol exceeds 20% by weight based on the total weight of the composition, this may lead to corrosion of the copper-containing lower film and it may be necessary to use a large amount of corrosion inhibitor in order to inhibit the corrosion.

In this case, due to the use of the large amount of corrosion inhibitor, a significant amount of corrosion inhibitor can be absorbed and remain on the surface of the lower film, thus lowering electrical characteristics of the copper-containing lower film and the like.

The stripper composition for removing photoresists may include a chained amine compound having a weight average molecular weight of more than 95 g/mol or a weight average molecular weight of 100 g/mol to 150 g/mol.

The chained amine compound having a weight average molecular weight of more than 95 g/mol can appropriately remove a natural oxide on a lower film, for example, a copper-containing film, while having the stripping ability of the photoresists, thereby more improving adhesion force with the copper-containing film and an insulating film of its upper portion, for example, a silicon nitride film and the like.

The chained amine compound having a weight average molecular weight of more than 95 g/mol may include (2-aminoethoxy)-1-ethanol (AEE), aminoethyl ethanol amine (AEEA), methyl diethanolamine (MDEA), diethylene triamine (DETA), diethanolamine (DEA), diethylaminoethanol (DEEA), triethanolamine (TEA), triethylene tetraamine (TETA) or a mixture of two or more thereof.

The chained amine compound having a weight average molecular weight of more than 95 g/mol can be contained in an amount of 0.1 to 10% by weight, or 0.2 to 8% by weight, based on the total weight of the composition.

If the content of the chained amine compound having a weight average molecular weight of more than 95 g/mol is less than 0.1% by weight based on the total weight of the composition, the stripping ability of the stripper composition for removing photoresists can be reduced.

Further, if the content of the chained amine compound having a weight average molecular weight of more than 95 g/mol exceeds 10% by weight based on the total weight of the composition, this may lead to corrosion of the lower film, for example, a copper-containing lower film and so, it may be necessary to use a large amount of corrosion inhibitor in order to inhibit the corrosion.

In this case, due to the use of the large amount of corrosion inhibitor, a significant amount of corrosion inhibitor can be absorbed and remain on the surface of the lower film, thus lowering electric characteristics of the copper-containing lower film and the like.

The weight ratio of the chained amine compound having a weight average molecular weight of more than 95 g/mol to the chained amine compound having the weight average molecular weight of not more than 90 g/mol may be 1:1 to 1:1.0, or 1:2 to 1:8, or 1:4 to 1:7.

If the weight ratio of the chained amine compound having a weight average molecular weight of more than 95 g/mol to the chained amine compound having the weight average molecular weight of not more than 90 g/mol is less than 1:1, the content of the chained amine compound having a weight average molecular weight of more than 95 g/mol is relatively increased, thereby reducing the rinsing ability of the stripper composition for removing photoresists.

Further, if the weight ratio of the chained amine compound having a average molecular weight of more than 95 g/mol to the chained amine compound having the weight average molecular weight of not more than 90 g/mol exceeds 1:10, the content of the chained amine compound having the weight average molecular weight of not more than 90 g/mol is relatively increased, thereby reducing the rinsing ability of the stripper composition for removing photoresists.

On the other hand, the stripper composition for removing photoresists may comprise a cyclic amine compound.

The cyclic amine compound can exhibit an excellent stripping ability of the photoresists and it can dissolve and remove the photoresists.

The cyclic amine compound may include 1-Imidazolidine ethanol (IME, LGA), aminoethyl piperazine (AEP), hydroxyl ethylpiperazine (HEP) or a mixture of two or more thereof.

The cyclic amine compound can be contained in an amount of 0.1 to 10% by weight, or 0.2 to 8% by weight, or 0.2 to 2% by weight, based on the total weight of the composition.

If the content of the cyclic amine compound is less than 0.1% by weight based on the total weight of the composition, the stripping ability of the stripper composition for removing photoresists can be reduced.

Further, if the content of the cyclic amine compound exceeds 10% by weight, the economy and efficiency of the process may be reduced due to the inclusion of an excess amount of cyclic amine compounds.

In particular, the weight ratio of the chained amine compound to the cyclic amine compound may be 1:5 to 1:20, or 1:6 to 1:15.

The chained amine compound may refer to the sum (on weight basis) of the chained amine compound having a weight average molecular weight of more than 95 g/mol and the chained amine compound having a weight average molecular weight of not more than 90 g/mol.

The stripper composition for removing photoresists may comprise an amide-based compound in which a linear or branched alkyl group having 1-5 carbon atoms is mono- or di-substituted with nitrogen.

The amide-based compound in which a linear or branched alkyl group having 1-5 carbon atoms is mono- or di-substituted with nitrogen can favorably dissolve the amine compound, and also enable the stripper composition for removing photoresists to be effectively immersed on the lower film, thus improving the stripping and rinsing abilities for the above stripper composition.

Specifically, the amide-based compound in which a linear or branched alkyl group having 1-5 carbon atoms is mono- or di-substituted with nitrogen may include an amide-based compound in which ethyl group is mono- or di-substituted with nitrogen.

The amide-based compound in which ethyl group is mono- or di-substituted with nitrogen may have the structure of the following Formula 11:

[Formula 11]

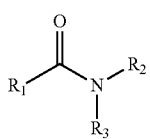

wherein $R_1$ is hydrogen, a methyl group, an ethyl group, or a propyl group, $R_2$ and $R_3$ are each independently hydrogen or a linear or branched alkyl group having 1 to 5 carbon atoms, and at least one of $R_2$ and $R_3$ is an ethyl group.

Examples of the linear or branched alkyl group having 1 to 5 carbon atoms used herein may include, but are not limited to, a methyl group, an ethyl group, a propyl group, a butyl group, an isobutyl group, a pentyl group and the like.

More specifically, examples of the amide-based compound in which ethyl group is mono- or di-substituted with nitrogen used herein may include, but are not limited to, N,N'-diethyl carboxamide (DCA) and the like.

Unlike conventional methylformamide (NMF) or dimethylacetamide (DMAC) and the like, the above N,N'-diethyl carboxamide (DCA) does not substantially exhibit reproductive or biological toxicity, nor substantially induces degradation with time of the amine compound, and so the stripper composition according to the above-described one embodiment can maintain excellent stripping and rinsing abilities for a long period of time. For example, the N,N'-diethyl carboxamide that may be used herein includes diethyl formamide diethyl acetamide, diethyl propionamide and the like.

For reference, in the case of methylformamide (NMF), dimethyl formamide (DMF) and dimethylacetamide (DMAC), their use in the display or device process is restricted due to reproductive or biological toxicity-related problems. In particular, the DMF is a material showing a reproductive toxicity and specific target organ toxicity and it is confirmed to be associated with leukemia, and so its use is restricted.

In comparison, the above N,N'-diethyl carboxamide (DCA) can achieve excellent physical properties such as an excellent stripping ability of the stripper composition, without exhibiting such reproductive and biological toxicity.

The amide-based compound in which a linear or branched alkyl group having 1-5 carbon atoms is mono- or di-substituted with nitrogen may be contained in an amount of 10 to 85% by weight or 15 to 70% by weight based on the total weight of the composition.

Depending on the range of the content, an excellent stripping ability of the stripper composition for removing photoresists can be assured, and the stripping and rinsing abilities thereof can be maintained with the passage of time for a long period of time.

In particular, the weight ratio of the amide-based compound in which a linear or branched alkyl group having 1-5 carbon atoms is mono- or di-substituted with nitrogen to the amine compound may be 1:2 to 1:20, or 1:3 to 1:12.

The amine compound refers to the sum (on weight basis) of a cyclic amine compound and a chained amine compound including a chained amine compound having a weight average molecular weight of more than 95 g/mol; a chained amine compound having a weight average molecular weight of not more than 90 g/mol and the cyclic amine compound.

On the other hand, the stripper composition for removing photoresists may comprise a polar organic solvent.

The above polar organic solvent can allow the stripper composition for removing photoresists to be better immersed on the lower film, thus assisting the stripping ability of the stripper composition for removing photoresists and further it can improve the rinsing ability of the stripper composition for removing photoresists to effectively remove stains on the lower film such as the copper-containing film.

The polar organic solvent can include alkylene glycol monoalkyl ether, pyrrolidone, sulfone, sulfoxide, or a mixture of two or more thereof.

More specifically, the alkylene glycol monoalkyl ether may include diethylene glycol monomethyl ether, ethylene glycol monoethyl ether, ethylene glycol monobutyl ether, propylene glycol monomethyl ether, propylene glycol monoethyl ether, propylene glycol monobutyl ether, diethylene glycol monoethyl ether, diethylene glycol monopropyl ether, diethylene glycol monobutyl ether, dipropylene glycol monomethyl ether, dipropylene glycol monoethyl ether, dipropylene glycol monopropyl ether, dipropylene glycol monobuthyl ether, triethylene glycol monomethyl ether, triethylene glycol monoethyl ether, triethylene glycol monopropyl ether, triethylene glycol monobutyl ether, tripropylene glycol monomethyl ether, tripropylene glycol monoethyl ether, tripropylene glycol monopropyl ether, tripropylene glycol monobuthyl ether or mixtures of two or more thereof.

In addition, in consideration of the excellent wetting ability of the stripper composition for removing photoresists and the improved stripping and rinsing abilities due to this, the alkylene glycol monoalkyl ether used herein may include diethylene glycol monomethylether (MDG), diethylene glycol monoethylether (EDG) or diethylene glycol monobutylether (BDG) and the like.

Examples of the pyrrolidone used herein may include, but are not particularly limited to, N-methylpyrrolidone, pyrrolidone, N-ethylpyrrolidone and the like.

Examples of the sulfone used herein may include, but are not particularly limited to, sufolane.

Examples of the sulfoxide used herein can include, but are not particularly to, dimethyl sulfoxide (DMSO), diethyl sulfoxide, dipropyl sulfoxide and the like.

Further, the polar organic solvent may be contained in an amount of 10 to 85% by weight, or 40 to 78% by weight, or 50 to 77% by weight, based on the total weight of the composition.

When the polar organic solvent satisfies the range of the above-described content, the excellent stripping ability of the stripper composition for removing photoresists can be assured, and the stripping and rinsing abilities can be maintained with the passage of time during a long period of time.

On the other hand, the stripper composition for removing photoresists may further comprise a corrosion inhibitor.

The above corrosion inhibitor can inhibit the corrosion of a metal-containing lower film such as a copper-containing film upon removal of photoresist pattern using the stripper composition for removing photoresists.

As the corrosion inhibitor, triazole-based compounds, tetrazole-based compounds and the like can be used. The triazole-based compounds can include compounds represented by the following Formula 1 or 2:

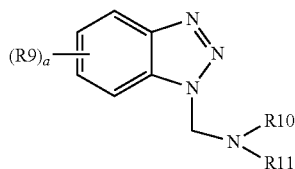

[Formula 1]

wherein $R_9$ is hydrogen or an alkyl group having 1 to 4 carbon atoms; $R_{10}$ and $R_{11}$ are the same or different from each other and are each independently a hydroxyl alkyl group having 1 to 4 carbon atoms, and a is an integer from 1 to 4,

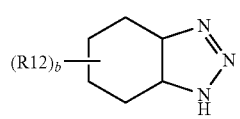

[Formula 2]

wherein, $R_{12}$ is hydrogen or an alkyl group having 1 to 4 carbon atoms, and b is an integer from 1 to 4.

Examples of such corrosion inhibitor used herein may include, but are not particularly limited to, triazole-based compounds such as a compound of Formula 1 wherein $R_9$ is methyl group, each of $R_{10}$ and $R_{11}$ are hydroxyethyl and a is 1, or a compound of Formula 2 wherein $R_{12}$ is a methyl group, and b is 1, tetrazole-based compounds such as 5-aminotetrazole or a hydrate thereof and the like can be used.

By using the above corrosion inhibitor, the stripping ability of the stripper composition can be excellently maintained while effectively inhibiting the corrosion of a metal-containing lower film.

In addition, the corrosion inhibitor may be contained in an amount of 0.01 to 0.5% by weight, or 0.05 to 0.3% by weight or 0.1 to 0.2% by weight based on the total weight of the composition.

If the content of the corrosion inhibitor is less than 0.01% by weight based on the total weight of the composition, it may be difficult to effectively inhibit the corrosion of the lower film.

Further, if the content of the corrosion inhibitor exceeds 0.5% by weight based on the total weight of the composition, a significant amount of corrosion inhibitor can be absorbed and remain on the lower film, thus lowering electrical characteristics of the copper-containing lower film and the like.

On the other hand, the stripper composition for removing photoresists can further comprise a silicon-based nonionic surfactant.

Since the silicon-based nonionic surfactant includes an amine compound and the like, it can be stably maintained without causing a chemical change, denaturation or degradation even in the stripper composition having a strong basicity. Also, the silicon-based nonionic surfactant can exhibit an excellent compatibility with the above-described aprotic polar solvent or protic organic solvent and the like.

Thus, the silicon-based nonionic surfactant can be mixed well with the other components and thus, it can lower the surface tension of the stripper composition and enable the stripper composition to exhibit excellent dampness and wetting ability for the photoresist to be removed and its lower film.

As a result, the stripper composition containing the silicon-based nonionic surfactant according to one embodiment of the invention can exhibit an excellent photoresist stripping ability as well as an excellent rinsing ability for the lower film. Therefore, even after the treatment of the stripper composition, stains or foreign materials do not substantially occur nor remain on the lower film and so the stains or foreign materials can be effectively removed.

Moreover, although the silicon-based nonionic surfactant is added in a very low amount, it can exhibit the above-described effects and minimize the occurrence of by-products due to the denaturation or degradation thereof.

The above silicon-based nonionic surfactant may comprise a polysiloxane-based polymer.

More specifically, examples of the polysiloxane-based polymer used herein may include polyether-modified acrylic functional polydimethylsiloxane, polyether-modified siloxane, polyether-modified polydimethyl siloxane, polyethyl alkyl siloxane, aralkyl-modified polymethyl alkyl siloxane, polyether-modified hydroxy functional polydimethyl siloxane, polyether-modified dimethylpolysiloxane, modified acrylic functional polydimethylsiloxane or a mixture of two or more thereof and the like.

The silicon-based nonionic surfactant may be contained in an amount of 0.0005 to 0.1% by weight, or 0.001 to 0.09% by weight, or 0.001 to 0.01% by weight based on the total weight of the composition.

When the content of the silicon-based non-ionic surfactant is less than 0.0005% by weight based on the total weight of the composition, the effects of improving the stripping and rinsing abilities for the stripper composition due to the addition of the surfactant may not be fully achieved.

Also, if the content of the silicon-based nonionic surfactant exceeds 0.1% by weight based on the total weight of the composition, during the stripping process using the stripper composition, a bubble can be generated at a high pressure, thus causing stains to occur on the lower film or causing malfunction of an equipment sensor.

The stripper composition for removing photoresists can further comprise conventional additives, if desired. The specific type and amount of the additives are not particularly limited.

Further, the stripper composition for removing photoresists can be prepared in accordance with a general method of mixing the above described components. There is no particular limitation in the specific method of producing the stripper composition for removing photoresists.

The photoresist stripper composition for removing photoresists can exhibit excellent stripping and rinsing abilities even without the use of reproductive toxic substances such as NMF and DMAC. Further, it can maintain excellent stripping ability with time and thus can be used to remove the remaining photoresist pattern on the lower layer.

Meanwhile, according to another embodiment of the invention, the method for stripping photoresists which comprises the steps of: forming a photoresist pattern on a substrate in which a lower film is formed; patterning the lower film with the photoresist pattern; and stripping the photoresist using the stripper composition for removing photoresists according to the above one embodiment can be provided.

The description related to the stripper composition for removing photoresists includes the detailed description related to the above one embodiment.

The method for stripping photoresists may comprise the steps of: forming a photoresist pattern through a photolithographic process on a substrate on which a lower film to be patterned is form a patterning the lower film with the photoresist pattern as a mask; and stripping the photoresist by using the above-described stripper composition.

In the method for stripping photoresists, the steps of forming a photoresist pattern and patterning a lower film can use a manufacturing process for the conventional device, and the specific production method for this is not particularly limited.

Meanwhile, examples of the step of stripping the photoresist by using the stripper composition for removing photoresists are not particularly limited, but for example, the steps of applying the stripper composition for removing photoresists to the substrate in which the photoresist pattern remains, and subjecting it to washing with an alkaline buffer solution followed by washing with ultrapure water and drying can be used.

As the above-described stripper composition exhibits an excellent stripping ability as well as a rinsing ability of effectively removing stains on the lower film and an ability for removing a natural oxide film, it can satisfactorily maintain the surface state of the lower film while effectively removing the photoresist film remaining on the lower film.

Accordingly, subsequent steps can be appropriately performed on the patterned lower layer to form a device.

According to the present invention, the stripper composition for removing photoresists which is capable of exhibiting excellent stripping and rinsing abilities for the photoresists and of minimizing reduction in the physical properties with time, even without inclusion of a solvent which shows a reproductive toxicity, and the method of stripping photoresists using the same can be provided.

Hereinafter, the present disclosure will be explained in detail with reference to the following examples. However, these examples are only to illustrate the inventive concept, and the scope of the inventive concept is not limited thereto.

Examples 1 to 4, Comparative Examples 1 and 2: Preparation of the Stripper Composition for Removing Photoresists According to the compositions shown in Table 1 below, each of the components were mixed to prepare the stripper compositions for removing photoresists of Examples 1 to 4 and Comparative Examples 1 and 2.

Specific composition ratios of the stripper composition for removing photoresist thus prepared are summarized in Table 1 below.

TABLE 1

Composition ratio of the stripper composition for removing photoresists

| | Examples | | | | Comparative Examples | |
| --- | --- | --- | --- | --- | --- | --- |
| Class | Ex. 1 (wt. %) | Ex. 2 (wt. %) | Ex. 3 (wt. %) | Ex. 4 (wt. %) | Comp. Ex. 1 (wt. %) | Comp. Ex. 2 (wt. %) |
| LGA | 0.5 | 0.5 | 0.5 | 0.5 | 3.0 | 3.0 |
| AEE | 1.0 | 0.5 | 1.0 | 1.0 | — | — |
| AIP | 5.0 | 3.0 | 3.0 | 3.0 | — | — |
| DMAC | — | — | — | — | 25.0 | — |
| NMF | — | — | — | — | 50.0 | 55.0 |
| DCA | 40.0 | 40.0 | 20.0 | 20.0 | — | — |
| BDG | — | — | — | — | 22.0 | 42.0 |
| EDG | 18.5 | — | 55.5 | 55.5 | — | — |
| MDG | 35.0 | 56.0 | 20.0 | 20.0 | — | — |
| Surfactant | — | — | 0.01 | — | — | — |

* LGA: 1-Imidazolidine ethanol (IME)
* AEE: (2-aminoethoxy)-1-ethanol
* AIP: (1-amino)-isopropantol
* DMAC: dimethylacetamide
* NMF: N-methylformamide
* DCA: diethyl carboxamide
* BDG: diethylene glycol monobutyl ether
* EDG: diethylene glycol monoethyl ether
* MDG: diethylene glycol monomethyl ether
* Surfactant: polyether-modified polydimethyl siloxane Experimental Example: Measurement of Physical Properties of the Stripper Compositions for Removing Photoresists Obtained in the Examples and Comparative Examples The physical properties of the stripper compositions for removing photoresists obtained in the Examples and Comparative Examples were measured by the method below and the results are shown in Tables below.

1. Stripping Ability 1-1. Evaluation for the Stripping Ability of a Stripper New Liquid First, 3.5 ml of a photoresist composition (trade name: JC-800) was added dropwise on 100 mm×100 mm glass substrate and the photoresist composition was coated under a speed of 400 rpm in a spin coating apparatus for 10 seconds.

Such a glass substrate was equipped with a hot plate and hard-baked at a temperature of 140° C. for 12 minutes to form a photoresist.

The glass substrate on which the photoresist is formed was air-cooled at room temperature and then cut in the size of 30 mm×30 mm to prepare a sample for evaluation for the stripping ability of a stripper new liquid.

500 g of the stripper compositions obtained in Examples and Comparative Examples were prepared. The photoresist on the glass substrate was treated with the stripper composition in the state where the temperature was raised to 50° C.

The time required to completely stripe and remove the photoresist was measured to evaluate the stripping ability of the stripper new liquid.

At this time, completion of stripping of the photoresists was determined by observing whether or not the photoresist remains by radiating with ultraviolet light on the glass substrate.

In the above method, the new liquid stripping abilities of the stripper compositions of Examples 1 & 2 and Comparative Examples 1 & 2 were evaluated and the results are shown in Table 2 below.

TABLE 2

New liquid stripping abilities of the stripper compositions for removing photoresists

| Hard-bake condition | | Stripping time (sec) | | | |
| --- | --- | --- | --- | --- | --- |
| Temperature (° C.) | Time (min) | Example 1 | Example 2 | Comparative Example 1 | Comparative Example 2 |
| 140 | 12 | 30 sec | 40 sec | 30 sec | 30 sec |

As shown in Table 2 above, it was confirmed that the stripper compositions of Examples 1 and 2, even though reproductive toxic materials, NMF or DMAC, are not included, exhibit photoresist stripping abilities (fast stripping time) equivalent to the stripper composition of Comparative Example 1 containing NMF and DMAC or the stripper composition of Comparative Example 2 containing NMF.

1-2. Stripping Ability with the Passage of Time

The samples for evaluation of the stripping ability were prepared in the same manner as in Experimental Example 1-1. 500 g of the stripper compositions obtained in Examples and Comparative Examples were prepared. The photoresist compositions were dissolved in an amount of 1% by weight with respect to the entire composition in a state in which the temperature was raised to 50° C.

The stripper compositions were heated for 48 hours to cause a change with the passage of time under severe conditions.

The stripping abilities with the passage of time of such stripper compositions were evaluated in the same manner as Experimental Example 1-1.

The stripping abilities with the passage of time of the stripper compositions obtained in Examples and Comparative Examples were evaluated by the above-described method, and the results are shown in Table 3 below.

TABLE 3

Stripping abilities with the passage of time of the stripper compositions for removing photoresists

| Example 1 | Example 2 | Comparative Example 1 | Comparaitve Example 2 |
| --- | --- | --- | --- |
| 30 sec | 40 sec | 40 sec | 40 sec |

As shown in Table 3 above, it was confirmed that the stripper compositions of Examples 1 and 2, even though reproductive toxic materials, NMF or DMAC, are not included, exhibit photoresist stripping abilities (fast stripping time) equivalent to or superior to the stripper composition of Comparative Example 1 containing NMF and DMAC or the stripper composition of Comparative Example 2 containing NMF.

2. Changes in the Amine Content

The stripper compositions of Example 1 and Comparative Examples 1 & 2 were prepared. Thereafter, while being stored at a temperature of 50° C. for 10 days, the change of amine (AIP, AEE, LGA) content with the passage of time was analyzed and evaluated by gas chromatography according to date of each storage, and the results are shown in Table 4 below.

TABLE 4

Change of amine content with the passage of time of the stripper compositions for removing photoresists

| Number of days | AIP of Ex. 1 (wt %) | AEE of Ex. 1 (wt %) | LGA of Ex. 1 (wt %) | LGA of Comp. Ex. 1 (wt %) | LGA of Comp. Ex. 2 (wt %) |
| --- | --- | --- | --- | --- | --- |
| 0 | 5.00 | 1.0 | 0.30 | 3.0 | 3.0 |
| 3 | 4.98 | 1.0 | 0.30 | 2.7 | 2.5 |
| 6 | 4.96 | 1.0 | 0.29 | 2.4 | 1.9 |
| 10 | 4.95 | 1.0 | 0.28 | 2.1 | 1.5 |

As shown in Table 4, it was confirmed that, even though the stripper composition of Example 1 was stored for a long period of time under severe conditions, the level of decrease in the amine content thereof with the passage of time was not large.

In comparison, it was confirmed that the amine content of the compositions of Comparative Example 1 and 2 was greatly reduced with the passage of time.

From these results, it was confirmed that a solvent such as DEF contained in the stripper composition of Example 1 did not substantially induce amine degradation, whereas a solvent such as NMF or DMAC contained in the composition of Comparative Examples induced amine degradation, thus reducing the stripping ability of the stripper composition with the passage of time.

3. Evaluation of Rinsing Ability 500 g of the stripper compositions of Examples 3 & 4 and Comparative Examples 1 & 2 were heated to a temperature of 50° C. and a glass substrate on which the films of Table 5 below were formed was used. The glass substrate was treated with the stripper compositions.

Then, the glass substrate was liquid-removed and a few drops of ultrapure water was added dropwise thereon and held for 50 seconds.

The substrate was again washed with ultrapure water, and stains and foreign materials on the glass substrate were observed with an optical microscope to evaluate the rinsing ability under the following criteria.

OK: Stains or foreign materials on the glass substrate were not observed; and

NG: Stains or foreign materials on the glass substrate were observed.

In the method as described above, the rinsing abilities with the passage of time of the stripper compositions of Examples 3 & 4 and Comparative Examples 1 & 2 were evaluated and the results are shown in Table 5 below.

These results are shown by evaluating the rinsing abilities under different conditions with the passage of time, respectively.

TABLE 5

Rinsing ability of the stripper composition for removing photoresists

| Film formed on the glass substrate | PR-dissolved amount (wt. %) | Time (hour) | Ex. 3 | Ex.4 | Comp. Ex. 1 | Comp. Ex.2 |
|---|---|---|---|---|---|---|
| ITO metal film | 1 | 24 | OK | OK | NG | NG |
| | | 48 | OK | NG | NG | NG |
| Si insulating film | | 24 | OK | OK | NG | NG |
| | | 48 | OK | NG | NG | NG |
| Cu/ITO film | | 24 | OK | OK | NG | NG |
| | | 48 | OK | NG | NG | NG |

As shown in Table 5 above, it was confirmed that the stripper composition of Example 4 expresses and maintains an excellent rinsing ability or a long period of time, even under various film conditions.

In comparison, it was confirmed that the stripper compositions of Comparative Examples 1 and 2 exhibit a reduction in the rinsing ability in the films formed on the glass substrate.

From these results, it could be confirmed that a solvent such as DEF contained in the stripper composition of Example 4 expresses and maintains the excellent rinsing ability.

In addition, it was confirmed that the stripper composition of Example 3 expresses and maintains the excellent rinsing ability for a long period of time, even under severe conditions of prolonged heating of the photoresist composition in consideration of the change appearance with the passage of time.

From these results, it could be confirmed that the rinsing ability is greatly improved due to the surfactant contained in the stripper composition of Example 3.

What is claimed is:

1. A stripper composition for removing photoresists which comprises: a chained amine compound having a weight average molecular weight of more than 95 g/mol; a chained amine compound having a weight average molecular weight of not more than 90 g/mol; a cyclic amine compound; an amide-based compound in which a linear or branched alkyl group having 1-5 carbon atoms is mono- or di-substituted with nitrogen; and a polar organic solvent,
wherein the weight ratio of the chained amine compound having a weight average molecular weight of more than 95 g/mol to the chained amine compound having the weight average molecular weight of not more than 90 g/mol is 1:1 to 1:10.

2. The stripper composition for removing photoresists of claim 1,
which comprises 0.1 to 10% by weight of the chained amine compound having a weight average molecular weight of more than 95 g/mol; 0.5 to 20% by weight of the chained amine compound having a weight average molecular weight of not more than 90 g/mol; 0.1 to 10% by weight of the cyclic amine compound; 10 to 85% by weight of the amide-based compound in which a linear or branched alkyl group having 1-5 carbon atoms is mono- or di-substituted with nitrogen; and 10 to 85% by weight of the polar organic solvent.

3. The stripper composition for removing photoresists of claim 1
wherein the chained amine compound having a weight average molecular weight of more than 95 g/mol includes one or more compound selected from the group consisting of (2-aminoethoxy)-1-ethanol, aminoethyl ethanolamine, methyl diethanolamine, diethylene triamine, diethanolamine, diethylaminoethanol, triethanolamine and triethylene tetraamine.

4. The stripper composition for removing photoresists of claim 1
wherein the chained amine compound having a weight average molecular weight of not more than 90 g/mol includes one or more compound selected from the group consisting of 1-aminoisopropanol, monomethanol amine, monoethanol amine, 2-methylaminoethanol, 3-aminopropanol and N-methylethylamine.

5. The stripper composition for removing photoresists of claim 1
wherein the cyclic amine compound includes one or more compound selected from the group consisting of 1-Imidazolidine ethanol, aminoethyl piperazine and hydroxyl ethylpiperazine.

6. The stripper composition for removing photoresists of claim 1
wherein the amide-based compound in which a linear or branched alkyl group having 1-5 carbon atoms is mono- or di-substituted with nitrogen includes an amide-based compound in which ethyl group is mono- or di-substituted with nitrogen.

7. The stripper composition for removing photoresists of claim 1
wherein the polar organic solvent includes one or more selected from the group consisting of alkylene glycol monoalkyl ether, pyrrolidone, sulfone and sulfoxide.

8. The stripper composition for removing photoresists of claim 7
wherein the alkylene glycol monoalkyl ether includes one or more selected from the group consisting of diethylene glycol monomethyl ether, ethylene glycol monoethyl ether, ethylene glycol monobutyl ether, propylene glycol monomethyl ether, propylene glycol monoethyl ether, propylene glycol monobutyl ether, diethylene glycol monoethyl ether, diethylene glycol monopropyl ether, diethylene glycol monobutyl ether, dipropylene glycol monomethyl ether, dipropylene glycol monoethyl ether, dipropylene glycol monopropyl ether, dipropylene glycol monobuthyl ether, triethylene glycol monomethyl ether, triethylene glycol monoethyl ether, triethylene glycol monopropyl ether, triethylene glycol monobutyl ether, tripropylene glycol monomethyl ether, tripropylene glycol monoethyl ether, tripropylene glycol monopropyl ether and tripropylene glycol monobuthyl ether.

9. The stripper composition for removing photoresists of claim 1 which
further comprises a corrosion inhibitor.

10. The stripper composition for removing photoresists of claim 9
wherein the corrosion inhibitor includes triazole-based compounds or tetrazole-based compounds.

11. The stripper composition for removing photoresists of claim 10
wherein the triazole-based compounds include compounds represented by the following Formula 1 or 2:

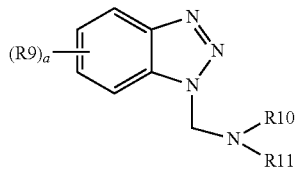
[Formula 1]

wherein $R_9$ is hydrogen or an alkyl group having 1 to 4 carbon atoms;
$R_{10}$ and $R_{11}$ are the same or different from each other and are each independently a hydroxyl alkyl group having 1 to 4 carbon atoms, and
a is an integer from 1 to 4,

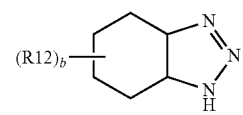
[Formula 2]

wherein, $R_{12}$ is hydrogen or an alkyl group having 1 to 4 carbon atoms, and b is an integer from 1 to 4.

12. The stripper composition for removing photoresists of claim 9
wherein the corrosion inhibitor is contained in an amount of 0.01 to 0.5% weight, based on the total weight of the composition.

13. The stripper composition for removing photoresists of claim 1
which further comprises a silicon-based nonionic surfactant.

14. The stripper composition for removing photoresists of claim 13
wherein the silicon-based nonionic surfactant includes a polysiloxane-based polymer.

15. The stripper composition for removing photoresists of claim 14
wherein the polysiloxane-based polymer includes one or more selected from the up consisting of polyether-modified acrylic functional polydimethylsiloxane, polyether-modified siloxane, polyether-modified polydimethyl siloxane, polyethyl alkyl siloxane, aralkyl-modified polymethyl alkyl siloxane, polyether-modified hydroxy functional polydimethyl siloxane, polyether-modified dimethylpolysiloxane and modified acrylic functional polydimethylsiloxane.

16. The stripper composition for removing photoresists of claim 13
wherein the silicon-based nonionic surfactant is contained in an amount of 0.0005 to 0.1% by weight based on the total weight of the composition.

17. A method for stripping photoresists which comprises the steps of: forming a photoresist pattern on a substrate in which a lower film is formed; patterning the lower film with the photoresist pattern; and stripping the photoresist using the stripper composition for removing photoresists of claim 1.

* * * * *